United States Patent [19]

Momotari et al.

[11] 4,122,143

[45] Oct. 24, 1978

[54] PROCESS FOR PRODUCING CURED PRODUCTS

[75] Inventors: Yoshitaka Momotari, Yokohama; Junji Hara, Kamakura; Tadashi Kitamura, Hiratsuka; Shigeo Iiyama, Yokohama, all of Japan

[73] Assignee: Mitsui Toatsu Chemicals, Inc., Tokyo, Japan

[21] Appl. No.: 689,658

[22] Filed: May 24, 1976

[51] Int. Cl.$^2$ .............................................. H01B 1/02
[52] U.S. Cl. ..................... 264/104; 252/512; 252/518; 264/236; 264/347
[58] Field of Search ............... 264/104, DIG. 46, 236, 264/347; 252/512, 518 R, 518; 260/42.14, 42.44, 45.75 C; 526/2

[56] References Cited

U.S. PATENT DOCUMENTS

| 2,687,395 | 8/1954 | Marks | 264/104 |
|---|---|---|---|
| 3,014,818 | 12/1961 | Campbell | 252/512 |
| 3,056,750 | 10/1962 | Pass | 252/512 |
| 3,360,589 | 12/1967 | Raichle et al. | 260/45.75 C |
| 3,474,464 | 10/1969 | Matthews et al. | 260/45.75 C |
| 3,647,532 | 3/1972 | Friedman et al. | 252/512 |
| 3,867,315 | 2/1975 | Tigner et al. | 252/512 |
| 3,983,075 | 9/1976 | Marshall et al. | 252/512 |

*Primary Examiner*—Jeffery R. Thurlow
*Attorney, Agent, or Firm*—Fisher, Christen & Sabol

[57] ABSTRACT

Process for producing conductive cured products are disclosed. In one embodiment a copper compound is reacted with a reducing substance capable of reducing said copper compound to metallic copper, in the presence of a metallic copper powder on a substrate, thereby reducing the copper compound to metallic copper and forming a conductive connected unit of said metallic copper powder, and the connected unit is then subjected to cure molding with a resinous curable component to integrate the constituent elements into the conductive cured product. In a second embodiment, the ligand portion of a copper compound of a ligand capable of reducing copper in a compound state is reacted with the copper moiety present in said copper compound in the presence of a metallic copper powder on a substrate. The copper moiety is reduced and precipitated to form a conductive connected unit of a metallic copper powder and the connected unit is then subjected to cure molding with a resinous curable component.

7 Claims, No Drawings

PROCESS FOR PRODUCING CURED PRODUCTS

BACKGROUND OF THE INVENTION

1. Field of the Invention

This invention relates to a process for producing cured products having superior properties such as initial conductivity, retention of conductivity, and low temperature moldability, which process comprises reducing copper in the cuprous and/or cupric state (copper in the compound state, copper in the oxidized state) in the presence of a metallic copper powder on a substrate to convert said copper to metallic copper, thereby forming a conductive connected unit of the metallic copper powder, and subjecting the resulting unit to cure molding using a resinous curable component.

2. Description of the Prior Art

Metals have superior electric conductivity, but suffer from the defect that because of their high melting points, they especially have inferior moldability at relatively low temperatures when compared with resins. Resins, on the other hand, have good moldability at relatively low temperatures, but since they generally have low conductivity as shown by their resistivity of $10^{11}$ ohms.cm or more, they cannot find applications in electrical fields which require a high level of conductivity, for example, as component parts of an electrical conductive circuit.

It would be necessary to consider the choice of metals in order to utilize both the conductivity of metals and the low temperature moldability of resins. Heretofore, a copper foil has been used as a material for a conductive circuit in printed circuit boards or the like and, in view of this, the development of a method which can afford a conductive cured product having good moldability at low temperatures using copper powder would be very useful in that the cured product obtained can be used in the form of paints, adhesives, or the like in various practical applications, for example, as members of a conductive circuit. Such a method, however, is unable to afford cured products which are satisfactory both in electric conductivity and its retention.

Furthermore, according to a conventional method in which a copper powder is merely mixed with a resin, the improvement of conductivity of the resin cannot at all be expected in whatever great amount the copper powder may be used. Our investigations have ascertained that this is because the peripheral edges of the copper powder particles are oxidized with the oxygen in air to form a coating of copper oxide which has poor conductivity.

We have also found that a cured product prepared, in an attempt to solve the above problem, by, for example, dissolving copper oxide with an acid such as hydrochloric acid to form a copper oxide-free copper powder (metallic copper powder) in accordance with a known method, and mixing the copper powder with a resin followed by curing, cannot retain its conductivity in air for long periods of time but gradually loses its conductivity, with the consequence that its conductivity is completely lost within a very short period of time of, say, about 1 day to 1 month. Therefore, cured products obtained by such a method using metallic copper powder have little or no ability to retain their initial conductivity.

Since good ability to retain conductivity is an absolute requirement in applications which require conductivity over long periods of time as in the case of members of electrical conductive circuits, the above method using metallic copper powder free from a copper oxide coating is not commercially feasible because of the defect of poor conductivity.

When a method is used in which a mixture of a metallic copper powder free from a copper oxide coating and a resin is cured and the cured product is treated with a treating agent for preventing oxidation of the surface of the metallic copper powder, such as an imidazole compound or benzotriazole, the oxidation of the surface of the metallic copper powder can be retarded to some extent, but the results are not satisfactory nor fully reliable with respect to the ability to retain conductivity. This means that a conductive cured product based on mere contact between metallic copper particles cannot possess sufficient reliability for practical purposes.

SUMMARY OF THE INVENTION

It is a primary object of the present invention to provide a method for preparing a cured product having good conductivity and ability to retain conductivity and also good moldability at low temperatures for practical purposes by utilizing a metallic copper powder.

Still further objects will become apparent from the following detailed description and specific examples which, while indicating preferred embodiments of the invention, are given by way of illustration only.

We have empirically confirmed that when a commercialgrade copper powder having copper oxide at the peripheral portions of particles thereof, but having no conductivity, is suspended in an ethanol solution of phosphoric acid while dissolving the copper oxide, and then precipitated, and after adding dimethyl phosphite, the suspension is allowed to stand at an elevated temperature, the above copper powder becomes a connected unit and the suspended state cannot be reproduced; that the connected unit of metallic copper powder obtained by removing the solvent by decantation exhibits superior conductivity; and that a cured product obtained by forming the above connected unit simultaneously with the curing of a resinous substance to integrate the connected copper powder unit and the resinous substance has sufficient ability to retain conductivity for practical purposes. In this regard, it should be noted that in the present invention, the connected unit of metallic copper powder is not formed by mere contacting of metallic copper particles with one another, but copper in the oxidized state is precipitated as metallic copper on the existing metallic copper powder as a result of a reducing and precipitating action to convert it to metallic copper, and the metallic copper powder particles are linked to one another through the precipitated metallic copper to form a connected unit.

In one aspect, the present invention provides a process for producing a conductive cured product which comprises reacting a copper compound with a reducing substance capable of reducing said copper compound to form metallic copper, in the presence of a metallic copper powder on a substrate, thereby to reduce said copper compound to metallic copper and form a conductive connected unit of said metallic copper powder, and subjecting the connected unit to cure molding using a resinuous curable component thereby to integrate said constituent elements.

In another aspect, the present invention provides a process for producing a conductive cured product which comprises reacting the ligand portion of a copper compound of a ligand capable of reducing copper in the compound state, with the copper moiety present in the molecules of said copper compound, in the presence of a metallic copper powder on a substrate thereby to reduce and precipitate the copper moiety in the molecules of said copper compound and form a conductive connected unit of said metallic copper powder, and subjecting the connected unit to cure molding using a resinous curable component thereby to integrate said constituent elements.

DESCRIPTION OF THE PREFERRED EMBODIMENTS

The metallic copper powder used in this invention is not limited in its fine structure and, for example, it may be in a flaky, dendroidal or spherical shape. Furthermore, it may be copper powder prepared by pulverizing metallic copper, or reduced copper. The particle diameter of the copper powder is usually not more than 5 mm., preferably 1 to 100 microns, most preferably 1 to 30 microns.

The metallic copper powder may be a powder composed of metallic copper along (i.e., a metallic copper powder having no copper compound on its surface either adhering thereto or as a coating), a powder of an alloy composed of metallic copper as a main ingredient, or a metallic copper powder whose surface is covered, either as an adhering matter or as a coating, with the copper compound used in this invention (which will be described hereinafter) whose copper moiety is reduced and precipitated by the reducing substance used in this invention. Of course, it is possible to use mixtures of the above metallic copper powders having different shapes or particle sizes.

The copper compound used in the present invention is a compound of copper in the cuprous and/or cupric state, and is roughly classified as follows:

The expression "the property of forming a resin" is used in the following description. A compound having "the property of forming a resin" denotes a compound which is a polymer before molding, or a compound that becomes a polymeric substance by a reaction after the molding, and which is capable of binding he constituent elements at the time of molding in the process of this invention into an integral cured article.

(A) Copper compounds not having the property of forming a resin:

(1) Inorganic types:

Copper halides such as cuprous chloride, cupric chloride, cuprous iodide and the like; inorganic acid salts of copper such as copper phosphate, copper pyrophosphate, cupric sulfate, basic copper carbonate and the like; inorganic copper compounds, for example, copper oxides such as cuprous oxide or cupric oxide and copper hydroxides such as cupric hydroxide;

(2) Organic types:

Organic acid salts of copper such as cupric acetate, cupric citrate, cupric naphthenate and the like; copper salts of inorganic acid esters such as butyl acid phosphate, 2-ethylhexyl acid phosphate and the like; copper salts of organic substituted inorganic acids such as p-toluene-sulfonic acid, phenylphosphonic acid and the like; and copper chelates such as copper ethylenediaminetetraacetate, copper nitrilotriacetate, copper acetylacetonate and the like.

(B) Copper compounds having the property of forming a resin:

These are copper compounds of resinous substances having a functional group capable of retaining copper in the compound state. Typical examples of the functional group are a carboxyl group, a sulfonic group, a phosphoric group, and a hydroxyl group including a hydroxyl group of the enol type.

In the present invention, the "resinous substance" including the above-mentioned resinous substances is required to be used in the liquid state only at the time of molding, and includes not only a compound which is a polymer before molding, but also a compound which becomes a polymeric substance by a reaction after the molding, so long as such compounds meet the above requirement. In addition, such "resinous substances" are curable substances which bind and cure the constituent elements at the time of molding in accordance with the process of this invention to form a cured composition in the desired shape, thus acting like a binder.

The resinous substance capable of being used in the liquid state at the time of molding means, as in the case of using a copper compound of the resinous substance in the liquid state by adding a third substance such as a solvent at the time of molding, that the copper compound of the resinous substance is a copper compound of a resinous substance which is curable and has the ability to maintain the cured product in the desired shape as a result of acting like a binder at the time of molding. The solvent is separated from the cured product at the time of molding.

Typical examples of compounds (B) above are a copper salt of a carboxyl-terminated polyester prepared from maleic anhydride and ethylene glycol, a copper salt of an adipic acid-modified epoxy resin prepared from adipic acid and a bisphenol-type epoxy resin, a copper salt of acrylic acid-grafted polypropylene glycol, a copper salt of itaconic acid, a copper salt of acrylic acid, a copper salt of methacrylic acid, a copper salt of a sulfonic acid-modified methacrylate polymer such as sulfoethylmethacrylate/butyl acrylate/methyl methacrylate copolymer, a copper salt of a phosphatemodified acrylate polymer such as mono(2-hydroxyethyl acrylate)-acid phosphate/ethyl acrylate/2-hydroxyethyl methacrylate/styrene copolymer, a copper salt of a carboxyl-terminated polybutadiene, a copper salt of a resol-type phenolic resin, and a copper salt of a vinyl chloride/vinyl acetate/maleic acid copolymer, etc. They may be copper salts of thermosetting or thermoplastic resins. Qualitatively, these resinous substances include a wide range of polymeric substances ranging from hard polymeric substances to soft rubbery substances.

The copper compounds used in this invention also include products obtained by coating or adhering the above copper compounds (A) on or to the surface of a metallic copper powder, or copper compounds obtained by dissolving such copper compounds (A) coated or adhered on or to the surface of the metallic copper powder with an acid capable of affording copper compounds (A) or (B) mentioned above (see Examples).

Metallic copper powders having the copper compounds used in this invention coated on or adhering to their surfaces are regarded as being composed of the metallic copper powder and copper compounds used in the present invention. For example, an ordinary commercially available copper powder (for example, industrial-grade copper powder) has a copper oxide such as cupric oxide coated on or adhering to its surface to some extent. Since such a copper powder can be regarded as being composed of the metallic copper powder and the copper compound used in this invention, from this standpoint it can be used in the present invention.

The reducing substance used in the present invention and capable of reducing the copper moiety of the above-mentioned copper compound is a chemical substance capable of reducing copper in a cuprous and/or cupric compound to metallic copper, and is itself oxidized upon reducing the copper in the copper compound to metallic copper. Such a reducing substance is classified roughly as follows:

(C) Reducing substances not having the property of forming a resin:

(1) Inorganic acids capable of reducing copper in the oxidized state (i.e., inorganic acids having a low oxidation state) such as phosphorous acid, hypophosphorous acid, sulfurous acid, hyposulfurous acid and the like, and their alkali metal salts;

(2) Trivalent phosphorous-containing acid type compounds including a phosphorous ester such as 2-hydroxy-3-phenoxypropyl phosphite, dimethyl phosphite, triethyl phosphite and an organic substituted phosphite such as phenyl phosphonous acid; and (3) Reducing sugars such as glucose, mannose and the like, ascorbic acid, hydrazine compounds such as hydrazine hydrate and the like, formaldehyde, boron hydride compounds, phosphine derivatives, metals more basic than copper in normal electrode potential value such as zinc, aluminum and the like, and alloys containing such a metal as an ingredient.

(D) Reducing substances having the property of forming a resin:

These compounds are resinous substances having a functional group capable of reducing the copper moiety of the above-mentioned copper compounds, and principal examples of the functional group are a phosphine, phosphite or hydrazine group.

Typical examples of the above reducing substances (D) are phosphorous-containing resinous substances having a low oxidation state, for example, a phosphite-modified polyester resin such as one obtained by reacting a trimethylolpropane monophosphite with maleic anhydride, a phosphite-modified epoxy resin such as phosphorous acid-added novolak-type epoxy resin, a phosphitemodified methacrylate polymer such as one obtained by reacting a glycidyl methacrylate/butyl acrylate/methyl acrylate copolymer with phosphorous acid, a diphenyl phosphine-added bisphenol-type epoxy resin, an acrylic compound such as 2-hydroxy-3-acryloxy-propyl phosphite or 2-hydroxy-3-methacryloxypropyl phosphite, a phosphitemodified acrylate polymer such as one obtained by reacting a glycidyl acrylate/2-hydroxyethyl acrylate copolymer with phosphorous acid and the like, and hydrazine-modified aniline resin and the like, and hydrazine-modified aniline resin. They may have the property of forming either a thermosetting or thermoplastic resin. Qualitatively, the above resinous substances include a wide variety of polymeric substances ranging from hard resins to soft rubbery resins.

The copper compounds of ligands capable of reducing copper in the compound state as used in the present invention are compounds resulting from the bonding of a ligand capable of reducing copper in the compound state, to copper in the cuprous and/or cupric state. These copper compounds of ligands are classified roughly as follows:

(E) Compounds not having the property of forming a resin:

Typical examples are copper salts of phosphorus oxyacid compounds having a low oxidation state containing at least one P-OH group in the molecule and being bonded to copper in the compound state through the P-OH group, such as copper phosphite, copper hypophosphite, a copper salt of 2-hydroxy-3-phenoxypropyl phosphite, a copper salt of dimethyl phosphite, a copper salt of phenylphosphorous acid, and the like.

(F) Compounds having the property of forming a resin:

These compounds are, for example:

(1) Resinous substances which hold copper in the compound state in a group capable of holding copper in the compound state, for example, a functional group such as carboxyl group, sulfonic group, phosphoric group or hydroxyl group, including a hydroxyl group of the enol type, and which contain a group capable of reducing copper in the compound state, for example, a phosphorus-type functional group having a low oxidation state such as a phosphine or phosphite group and a functional group such as a hydrazine group; and (2) Resinous substances which have a phosphite group (i.e., a phosphorus oxyacid-type functional group having a low oxidation state) having at least one p-OH group as a functional group and in which copper in the compound state is bonded to the P-OH group.

Examples of preferred species include those which provide a pentavalent P-OH group upon reducing copper in the compound state, and those compounds indicated under (1) above which have a phosphoric group as a group capable of holding copper in the compound state. Examples of the preferred compounds (1) above are a copper salt of a resinous substance prepared by adding dimethyl phosphite to a glycidyl methacrylate/butyl acrylate/methyl methacrylate copolymer and then further adding phosphoric acid. Example of preferred compounds (2) are a copper salt of a phosphite-modified polyester resin such as one obtained by reacting a pentaerythritol monophosphite with maleic anhydride, a copper salt of a phosphitemodified epoxy resin such as a phosphorous acid-added bisphenoltype epoxy resin, a copper salt of a phosphite-modified methacrylate polymer such as one obtained by reacting a glycidyl methacrylate/2-hydroxyethyl acrylate copolymer with phosphorous acid, and a copper salt of a phosphite-modified acrylate polymer such as one obtained by reacting a glycidyl acrylate/butyl acrylate/2-hydroxyethyl methacrylate copolymer with phosphorous acid, and the like.

These resinous substances may either be thermosetting or thermoplastic, and include a wide range of polymeric substances ranging from hard resins to soft rubbery resins.

Those phosphorus-containing substances in the various oxidation states shown in (C), (D), (E) and (F) above which are converted to phosphorous oxyacid compounds of a higher oxidation state upon reducing copper in the compound state and have a P—OH group in the molecules even after being converted to such phosphorus oxyacid compounds of a higher oxidation state are preferred in the present invention since they have a antirust effect on the metallic copper powder used in the present invention and the metallic copper reduced and precipitated by the process of this invention.

The substrate used in this invention is not limited in material, shape, insulating property, etc. Materials of the substrate include, for example, organic polymeric substances such as phenolic resins, epoxy resins, unsaturated polyester resins, polyethylene, polypropylene, polystyrene, polyamides, polyimides, polyphenylene oxide, polyphenylene sulfide, polyoxymethylene, polysulfone, polycarbonate, polyethylene terephthalate, fluorine resins, or silicone resins; products formed by impregnating glass fibers, paper, etc., with such organic polymeric substances; inorganic substances such as glass, ceramics, metals such as copper, brass, iron, nickel or aluminum or alloys of these metals; and products obtained by coating the above organic polymeric compounds or inorganic substances with copper, nickel, aluminum or solder by such a method as plating or vacuum deposition.

The substrate may be of a definite shape, such as in the form of sheet, cylinder or rod and the above-mentioned materials and shapes can each be chosen either singly or in combination.

The amount of the metallic copper powder used in the present invention varies widely according to, for example, the shape or particle diameter of the powder, but (1) is usually 10 to 99% by weight, preferably 30 to 95% by weight, based on the total amount of the metallic copper powder, the copper compound and the reducing substance, and (2) when the metallic copper powder and the copper compound of a ligand capable of reducing copper in the compound state are used, the amount of the metallic copper powder is 10 to 99% by weight, preferably 30 to 95% be weight, based on the total amount of these.

The amount of copper compound (1) or (2) above is not more than 20% by weight, preferably 1 to 10% by weight, calculated as cuprous and/or cupric copper based on the metallic copper powder used.

The amount of the reducing substance in the case of (1) or the ligand capable of reducing copper in the compound state in the case of (2) depends upon the amount of the copper compound used and the reducing ability of the reducing substance in (1) or the ligand in (2) per unit weight thereof. It is preferred to use the reducing substance in an amount sufficient to reduce and precipitate all the cuprous and/or cupric copper to metallic copper.

In the preparation of a cured product by the process of this invention, a resin (R) to be described below is added in the case of using a copper compound (A) and a reducing compound (C), or in the case of using (E). When at least one of the copper compound and reducing substance used in this invention is a resinous substance, that is, when either one of (B) or (D) is used or (F) is used, the resin (R) need not be incorporated. The amounts of these resinous substances and resin (R) may be those sufficient to bind the constituent elements into an integral cured article.

The above resins (R) are a generic term for curable substances which afford moldability to the constituent elements and bind them into an integral unit at the time of molding, that is to say, curable substances capable of retaining the molded product in the desired shape as a result of acting like a binder. Even when these resins (R) are solid per se, it does not matter so long as they can be used in the liquid state in the process of this invention. They can be rendered liquid, for example, by dissolving in a solvent.

Examples of resins (R) include polyester resins, phenolic resins, aniline resins, amino resins (for example, a butylated melamine resin or a urea resin), vinyl resins (for example, an acrylate resin or a vinyl acetate resin), epoxy resins, urethane resins, cellulose resins, furan resins, polyether resins, vinyl polymerizable resins (resins cross-linkable by the polymerization of a vinyl group, such as an unsaturated polyester resin or an acrylate resin), vinyl chloride-type polymers, ethylene-type polymers, styrene-type polymers, acrylamide-type polymers, butadiene-type polymers, rosintype polymers, silicone resins and the like. Products obtained by modifying the above resins with known modifiers such as linseed oil or linoleic acid can also be used. Mixtures of the above resins can of course be used.

The above resin (R) can be used in any desired form, such as a solution in an organic solvent, an aqueous solution, an aqueous emulsion, or a 100% liquid resin, and there is no particular limitation on the form of this resin (R) to be used.

The following embodiments can be used to cure the above resinous substances or resin (R).

For example, in the case of room temperature drying resins (lacquer type), they are cured by evaporating off the volatile substance by drying. When these resins are thermosetting, they are optionally cured under heat according to the type of resin. The above-mentioned vinyl polymerizable resins such as an unsaturated polyester resin or acrylate resin can be cured by known means using a known polymerization initiator such as azobisisobutyronitrile, di-t-butyl peroxide, benzoyl peroxide, and the like. The epoxy resins or phenolic resins can be cured by known means using a known curing agent such as hexamethylene tetramine, p-toluenesulfonic acid, triethylamine, phosphoric acid, acetic acid, triethylene tetramine, a polyamide resin, 2-ethyl-4-methyl imidazole, phthalic anhydride, and the like. Oxidative curing type resins can be cured by known means using a known dryer such as zinc naphthenate, cobalt octylate, and the like. Thermoplastic resins can be cured by heating and then cooling in accordance with known means. In short, known curing means can be employed according to the types of resinous substances and resins (R). As a result of curing, the connected unit of copper powder is maintained as an integral cured product.

The preferred temperature at which the reduction is carried out in the present invention differs according to the type of compound (C), (D), (E) or (F), but usually is not more than 250° C.

The reduction in accordance with this invention is preferably carried out during the stage of curing the resinous substances (B), (D) or (F) and the resin (R). If the reducing reaction occurs too early or too late with respect to the curing stage, it affects the ability of the resulting cured product to retain conductivity. In particular, the reducing temperature is preferably 50° to 180° C. in view of the curing conditions or the operability of the cured product in end uses. Accordingly, the temperature at which the above resinuous substances and the resin (R) are cured is usually not more than 250° C., preferably from room temperature to 200° C., especially preferably from 50° C. to 180° C.

The atmosphere in which the above reducing reaction is carried out is any desired atmosphere such as air or an inert gas such as nitrogen or carbon dioxide gas. The atmosphere in which the curing of the resinous substances and resin (R) is carried out may also be any desired atmosphere such as air or one or more of the same inert gases as mentioned above.

At the time of curing the resinous substances and resins (R), various known additives may be incorporated. Examples of these additives include molecular weight modifiers such as mercaptoacetic acid, n-dodecyl mercaptan, carbon tetrachloride, carbon tetrabromide, and the like; stabilizers such as hydroquinone, p-benzoquinone, phenothiazine, t-butyl catechol, and the like; reactive diluents such as butyl glycidyl ether, phenyl glycidyl ether, allyl glycidyl ether, liquid polysulfide rubber, and the like; plasticizers such as dibutyl phthalate, dioctyl phthalate, butylbenzyl phthalate, dioctyl adipate, and the like; reducing reaction modifiers such as noble metals of Groups I$b$ and VIII of the Periodic Table and compounds of these noble metals, or thiourea; chelating agents such as acetylacetone, ethylenediaminetetraacetic acid, triethanolamine, nitrilotriacetic acid, phytic acid, and the like; acidity modifiers, for example, basic alkaline metal compounds such as lithium hydroxide, potassium hydroxide, sodium hydroxide, and the like; amines such as triethylamine, dimethylbenzylamine, N,N-diethylaminoethanol, N,N-dimethylaminomethylphenol, N,N-dimethyl aniline, and the like; acids such as acetic acid, propionic acid, oxalic acid, phosphoric acid, and the like; sodium phosphate, sodium acetate, or sodium oxalate, etc.; thickening agents such as polyvinyl alcohol, polyvinyl pyrrolidone, cellulose acetate butyrate, a polyvinyl butyral resin, and the like; various surface active agents such as potassium oleate, sodium dodecylbenzenesulfonate, sodium laurysulfate, polyoxyethylene lauryl ether, and the like; solvents; coloring agents; fire retardants; settling inhibitors; foaming agents; and thixotropic agents, etc.

The cured products obtained by the process of this invention as a result of using the above resinous substances and resin (R) find a wide range of utility as will be described hereinbelow. If required according to the end use or the environment of use or in order to ensure reliability, the cured products may be subjected to various protecting treatments. For example, the cured products may be electrically or chemically plated using nickel, solder, copper, silver or gold. Or an insulating protecting coating is formed on the surface of the cured product using various resins of the epoxy, phenol or rosin type. Or the surfaces of the cured products are treated chemically with a benzotriazole silicone type or imidazole type treating agent.

The conductive cured products obtained by the process of this invention as a result of curing the resinous substances and resins (R) have superior conductivity and the ability to retain conductivity almost permanently, and also possess superior moldability at low temperatures. Because of these valuable properties, they are commercially useful in various forms such as paints, adhesives, printing ink or tape sheets in electrical and electronics fields as an electrically conductive circuit, a thermal release circuit, packings of plated through-holes, or fixing of component parts; in the field of automobiles as a dew inhibiting circuit in windowpane or an antenna for receiving FM broadcasting; and in the field of housing as a heater or a robbery- or burglary-preventing circuit in windowpanes.

In one embodiment of this invention, a screen printing ink is prepared using the resinous substance or liquid resin (R) and applied to an electrical insulating substrate by screen printing and then the ink is cured to form an electrical conductive circuit. This conductive circuit is free from the defects of reduced insulating property between circuits as a result of long-term electric load and from the consequent short-circuiting between the circuits which are seen in a conductive circuit produced by curing a liquid resin containing a silver powder as a filler. Since superior serviceability not obtainable with the conventional techniques using a copper powder can be attained by the process of this invention, the industrial value of the present invention is great.

The following examples illustrate the present invention more specifically. All parts and percentages in these examples are by weight. Furthermore, the concentration of a certain component is the weight percent thereof based on the total weight of all the components present.

The "printed material obtained by a screen printing process" used in the following examples was prepared in the following manner.

S-shaped lines each having a total length of 200 mm. and a width of 1 mm. and arranged at intervals of 0.5 mm. were provided by the following method on the surface of a material to be printed. A plate film was photographically formed by a direct method on a 180-mesh polyester screen so that the entire film thickness of the screen became 140 microns, and meshes other than the required lines were clogged. Using the resulting screen printing screen, each of the liquid compositions used in the following examples was printed on each of the substances used in these examples by a manual process using a squeegee made of a polyurethane rubber with a rubber hardness of No. 70, and then the printed liquid composition was cured under the curing conditions used in each of the experiments to form a printed material.

The resistance value described in the following examples as a measure for conductivity and the ability to retain conductivity was measured by a tester (Multi-tester K-30D, a trademark for a product of Sanwa Electric Instrument Co., Ltd., Japan) which was brought into contact with the cured product sample while the test pin distance from the measuring terminal of the tester was fixed at 1 cm.

The resistivity value was calculated after measuring the resistance value by means of a Wheatstone bridge (Type 2755, a product of Yokogawa Electric Works Ltd., Japan) and measuring the thickness, length and width of the cured product.

In each of the above cases, specimens having a measured value exceeding $10^6$ ohms were regarded as lacking conductivity.

The conductivity retaining test described in the examples was performed under an accelerated test condition at 100° C. in a constant temperature device. This accelerated test condition is one of those conditions employed in a durability test of electrical component parts of, for example, household electric appliances. When the test specimen is found to have a conductivity retention of 100 hours under this accelerated test condition, it is generally regarded as corresponding to a durable period of more than several years in a natural environment in Japan.

The potential load test described in the following examples was carried out in the following manner.

A through-hole with a diameter of 0.5 mm. was provided in a substrate at both end portions of a cured product that forms the above-described printed material obtained by a screen printing process. An enamelled copper wire was deprived of the enamel coating at a portion about 1 cm. from the end of the wire, and the exposed copper wire portion was immersed in a conductive adhesive (Dotite D-750, a trademark for a product of Fujikura Kasei Co., Ltd. Japan) to adhere the adhesive thereto. The copper wire so treated was inserted into the holes, and by storing the assembly in a constant temperature device at 100° C. for 1 hour, the adhesive was cured to form an electricity conductive lead wire. An electric current was applied to the entire conductive circuit formed so that the loaded electrical power became 1 watt using a regulated DC power supply system (Type GPO 30-5, a tradename for a product of Takasago Seisakusho Ltd., Japan). The occurrence of wire breakage and abnormal conditions owing to a reduction in insulating properties were checked.

EXAMPLE I

Liquid compositions obtained in Runs Nos. 1 to 3 below were coated by means of a glass rod on the surfaces of three glass sheets whose one surface had been cleaned with ethyl acetate, to a thickness of 200 microns. The coated glass sheets were each cured under heat in a constant temperature device at 80° C. for 1 hour. The conductivity of the cured coatings and their conductivity after a conductivity retaining test were measured by the method described hereinabove, and the results are shown in Table 1.

Run No. I-1 (Control)

A liquid composition obtained by admixing a mixture of 50 parts of a copper powder (325 mesh) whose surface was covered with a copper oxide coating and 62 parts of an alcohol-soluble resol-type phenolic resin (to be referred to as resin A) having a non-volatile content of 80% after curing, with 5 parts of a 30% by weight ethanol solution of p-toluenesulfonic acid as a curing catalyst for the phenolic resin and 15 parts of an ethanol/toluene mixed solvent (mixing volume ratio = 1:1).

Run No. I-2

A liquid composition obtained by immersing the same copper powder as used in Run No. 1 in a solution of hydrochloric acid in a mixed solvent of water and methanol (volume ratio 1:1) in a concentration of 5% to remove the copper oxide coating on the surface of the copper powder and to form a metallic copper powder (to be referred to as treated copper powder A), and admixing a mixture of 50 parts by weight of the resulting metallic copper powder and 62 parts of resin A, with 5 parts of a 30% ethanol solution of p-toluenesulfonic acid and 15 parts of the mixed ethanol/toluene solvent as used in Run No. 1.

Run No. I-3

A liquid composition obtained by mixing 50 parts of treated copper A, 5 parts of copper naphthenate containing 10% of copper, 62 parts of resin A and 20 parts of a mixture of phosphorous acid and the above ethanol/toluene mixed solvent with stirring.

Table 1

| Run No. | Resistance after curing (ohms) | Resistance after the conductivity retaining test (ohms) | Remarks |
| --- | --- | --- | --- |
| I-1 | No conductivity | No conductivity | Control |
| I-2 | 2500 | No conductivity | |
| I-3 | Less than 1 | Less than 1 | Invention |

EXAMPLE II

Each of the liquid compositions obtained in the following Run Nos. II-1 to II-7 was coated on the surface of each of the substrates described in Table 2 in the same way as in Example I, and the coated articles were cured under the conditions shown in Table 2. The conductivity of the cured coatings and their conductivity after the conductivity retaining test were measured, and the results are shown in Table 2.

Run No. II-1

A liquid composition obtained by mixing (A) 7 parts of a liquid acrylate resin obtained by diluting an acrylate copolymer resin composed of 40 parts of styrene, 40 parts of methyl methacrylate, 7 parts of butyl acrylate and 13 parts of 2-hydroxyethyl methacrylate with a mixed solvent of toluene and butyl acetate (the toluene/butyl acetate mixing weight ratio = 80/20) to a resin content of 30%, (B) 11 parts of a metallic copper powder (200 mesh; to be referred to simply as treated copper powder B) obtained by treating a copper powder with a solution of phosphoric acid in a mixture of methanol and water (mixing volume ratio 1:1) in a concentration of 5% to remove the copper oxide on the surface, (C) 0.3 part of cupric chloride dihydrate, and (D) 0.5 parts of sodium sulfite and 1 part of phosphoric acid as an acidity modifier.

Run No. II-2

A liquid composition composed of 80 parts of a liquid resin containing 0.7% of copper (the copper compound (B) described hereinabove) obtained by reacting cupric oxide with a solution of a copolymer resin composed of 50 parts of mono(2-hydroxyethyl acrylate) acid phosphate, 46 parts of ethyl acrylate, 204 parts of 2-hydroxyethyl methacrylate and 200 parts of styrene in 500 parts of dimethyl formamide, 60 parts of treated copper powder A and 12 parts of a 10% methanol solution of phosphorous acid.

Run No. II-3

A liquid composition composed of 75 parts of treated copper powder B, 3 parts of copper acetylacetonate, 7 parts of 2-hydroxy-3-phenoxypropyl phosphite, 16 parts of resin A and 20 ml. of ethanol.

Run No. II-4

A liquid composition prepared by mixing 75 parts of copper powder (325 mesh) containing 1.2% of copper oxide on its surface with 3 parts of phenylphosphonic acid and 20 parts of ethanol to convert the copper oxide on the surface of the copper powder to a copper salt of phenylphosphonic acid (the substance (A) described hereinabove), and then adding 21 parts of resin A and 5 parts of dimethyl phosphite.

Run No. II-5

A liquid composition prepared by mixing 30 parts of copper powder (325 mesh) containing 1.2% of copper oxide on its surface with 2 parts of phosphoric acid and 20 parts of ethanol to convert the copper oxide on the surface of the copper powder to copper phosphate (the substance (A) described hereinabove), and then adding 20 parts of resin A, 7 parts of tri-n-butyl phosphine and 35 parts of brass powder (average particle size 20 microns) containing 11% by weight of zinc as an alloy ingredient.

Run No. II-6

A liquid composition prepared by mixing 75 parts of copper powder (325 mesh) containing 4.7% of copper oxide on its surface with 30 parts of a solution consisting of 6 parts of phosphorous acid and 24 parts of methanol to convert the copper oxide on the surface of the copper powder to copper phosphite (the substance (E) described hereinabove), and adding 24 parts of resin A.

Run No. II-7

A liquid composition prepared by reacting 5 parts of basic copper carbonate with 31 parts of an aqueous phosphite-modified methacrylate polymer containing 20% of water and obtained by reacting a copolymer of 80 parts of 2-hydroxyethyl acrylate and 20 parts of glycidyl methacrylate with 18 parts of phosphorous acid thereby to form a copper salt of the phosphite-modified methacrylate polymer (the substance (F) described hereinabove), and then adding 70 parts of treated copper powder B.

microns) whose copper oxide on its surface had been removed by a solution of hydrochloric acid in a mixed solvent of water and methanol (the mixing volume ratio 1:1) in a concentration of 5%, (2) 5 parts of copper acetate, (3) 44 parts of a solution of 14 parts of phosphorous acid in 30 parts of diacetone alcohol, and (4) 45 parts of resin A used in Example I.

Run No. III-2

A liquid composition composed of (1) 70 parts of copper powder (average particle diameter 20 microns) containing 3.5% of copper oxide on its surface and (2) 33 parts of an aqueous phosphite-modified acrylate polymer (the substance (D) described hereinabove) containing 10% of water and obtained by reacting a copolymer of 80 parts of 2-hydroxyethyl acrylate and 20 parts of glycidyl acrylate with 19 parts of phosphorous acid.

Table 3

| Run No. | Substrate | Curing Conditions Temperature (°C.) | Curing Conditions Time (minutes) | Conductivity (resistivity, ohms·cm.) | Change of resistivity after the conductivity retaining test (%) |
|---|---|---|---|---|---|
| III-1 | Paper-based Phenolic resin sheet | 80 and then 140 in a stream of nitrogen | 30 60 | $1 \times 10^{-3}$ | 0.7 |
| III-2 | paper-based Phenolic resin sheet | 70 and then 120 | 60 30 | $2 \times 10^{-4}$ | 2 |

Current loading was performed for one year by the potential load test on the resulting printed materials. No change was observed in each of these printed materials.

Table 2

| Run No. | Substrate | Curing Conditions Temperature (°C.) | Time (minutes) | Resistance after curing (ohms) | Resistance after the conductivity relating test (ohms) |
|---|---|---|---|---|---|
| II-1 | Glass sheet | 60 | 120 | 4 | 6 |
| II-2 | Paper-based Phenolic resin sheet | 60 and then 125 | 30 90 | less than 1 | less than 1 |
| II-3 | Paper-based phenolic resin sheet | 70 and then 130 | 60 60 | less than 1 | less than 1 |
| II-4 | Paper-based Phenolic resin sheet | 80 and then 120 | 30 60 | less than 1 | less than 1 |
| II-5 | Paper-based Phenolic resin sheet | 80 and then 100 | 30 60 | less than 1 | less than 1 |
| II-6 | Paper-based Phenolic resin sheet | 60 and then 120 | 60 30 | less than 1 | less than 1 |
| II-7 | Glass sheet | 80 and then 110 | 60 30 | less than 1 | less than 1 |

EXAMPLE III

Each of liquid compositions obtained in Runs Nos. III-1 and III-2 below was applied to each of the substrates shown in Table 3 under the curing conditions shown in Table 3 to form printed materials in accordance with a screen printing process. The conductivity of the resulting printed materials and their conductivity after the conductivity retaining test were determined by their resistivity and the results obtained are shown in Table 3.

Run No. III-1

A liquid composition composed of (1) 50 parts of a metallic copper powder (average particle diameter 20

EXAMPLE IV

70 Parts of copper powder (average particle diameter 20 microns) containing 3.5% of copper oxide on its surface) was mixed with 5 parts of butyl phosphate and 5 parts of ethanol to convert the copper oxide on the surface of the copper powder to a copper salt of butyl phosphate (the substance (A) described hereinabove), and then 24 parts of resin A, 6 parts of phosphorous acid and 5 parts of ethanol were mixed. Using the resulting liquid composition, the following experiment was performed.

Two intermittent circuits having a width of 1 mm. and a length of 50 mm. were formed by an etching process in a paper-based phenolic resin printed circuit boards. A resistor (750 ohms) with lead wires, which was shaped like an inverted u (⊓) so as to overide terminal holes of the two intermittent circuits, was immersed in the above liquid composition as a conductive adhesive so that it adhered to the lead wire portions on both sides. The resistor was inserted in the holes, and the entire assembly was stored in a constant temperature device at 70° C. for 30 minutes to cure the adhesive. With regard to the two circuits of the resulting resistor-mounted printed circuit board, the resistance value was measured by bringing a test pin from the measuring terminal of the above-mentioned tester into contact with the resistor-free terminals of the circuits connected by the resistor. The resistance value was found to be 750 ohms.

On the other hand, the printed circuit board was turned downwardly, and a load of 1 kg was exerted on the center of the mounted resistor to examine its mounting strength. But no change such as detachment was observed.

The resistor-mounted printed circuit board showed a resistance of 750 ohms even after it was subjected to the conductivity retaining test.

What is claimed is:

1. A process for producing a conductive cured product which comprises reacting a copper compound which is in the cuprous and/or cupric state with a reducing substance capable of reducing said copper compound to metallic copper, in the presence of both a metallic copper powder and a resinous curable component on a substrate, the amount of said copper compound being not more than 20% by weight calculated as cuprous and/or cupric copper based on the weight of said metallic copper powder, to reduce said copper compound to metallic copper which precipitates on said metallic copper powder to link the particles of said metallic copper powder to form a conductive connected unit of said metallic copper powder, and cure molding said resinous curable component during the reduction of said copper compound to integrate said connected unit and said resinous curable component into said conductive cured product.

2. The process according to claim 1 wherein the amount of metallic copper powder used is from 10 to 99% by weight based on the total amount of metallic copper powder, copper compound and reducing substance.

3. The process of claim 1 wherein the resinous curable component is cured and the copper compound is reduced at a temperature of less than 250° C.

4. The process of claim 1 wherein the copper compound which is reacted with said reducing substance is coated on or adheres to the surface of the metallic copper powder particles.

5. The process of claim 1 wherein said metallic copper powder is a powder of an alloy composed of metallic copper as a main ingredient.

6. The process of claim 1 wherein the copper compound is a copper compound of a resinous curable substance having a functional group capable of retaining copper in the compound state.

7. The process of claim 1 wherein the reducing substance is a curable resinous substance having a functional group capable of reducing the copper moiety of said copper compound.

* * * * *